CIRCUITS UTILIZING THE THRESHOLD PROPERTIES OF RECOMBINATION RADIATION SEMICONDUCTOR DEVICES

Filed April 24, 1964

INVENTORS
JEROME M. LAVINE
PHILIP W. CHENEY

BY Donald Brown

ATTORNEY

United States Patent Office 3,499,158
Patented Mar. 3, 1970

3,499,158

CIRCUITS UTILIZING THE THRESHOLD PROPERTIES OF RECOMBINATION RADIATION SEMICONDUCTOR DEVICES

Jerome M. Lavine, Lincoln, and Philip W. Cheney, Acton, Mass., assignors to Raytheon Company, Lexington, Mass., a corporation of Delaware Filed Apr. 24, 1964, Ser. No. 362,399
Int. Cl. H01j *39/12*
U.S. Cl. 250—217 2 Claims

ABSTRACT OF THE DISCLOSURE

Circuits utilizing the threshold properties of recombination-radiation semiconductor devices for logic functions and circuits utilizing the difference in threshold in such devices made from different semi-conductor materials as well as the difference in radiation wavelength to provide quantizing functions.

This invention relates to electroradiative circuits and, more particularly, to circuits utilizing recombination-radiation and lasering semiconductor devices, such as diodes.

For some time now, proposals have been put forward to fabricate photoswitching elements capable of providing switching properties useful in computer and related circuitry. These prior elements have typically taken the form of gas discharge elements, such as neon bulbs which are inherently slow. Other attempts have been made utilizing electroluminescent panels. These electroluminescent devices require relatively high input voltages and are, additionally, slow transition or switching devices.

Accordingly, it is a principal object of this invention to provide new and improved photoswitching circuits.

It is a further object of this invention to provide electro-radiative circuits having switching speeds in the order of .1 nanosecond.

It is an additional object of this invention to provide improved computer logic circuitry utilizing recombination-radiation diodes.

It is another object of this invention to provide a quantizing circuit utilizing recombination-radiation or lasering diodes.

In accordance with this invention, radiation circuits are provided which utilize junction-type semiconductor devices. These junction-type semiconductor devices provide high speed on and off switching radiation transitions. In one embodiment, a recombination-radiation diode is utilized as a logical computer element. In another embodiment, a matrix of recombination-radiation diodes is utilized to provide a radiating matrix configuration. In a third embodiment, a plurality of recombination-radiation diodes, providing different output wavelength radiative energy, are utilized in a signal quantizing circut.

Further objects of this invention will become apparent from the following description when taken in conjunction with the accompanying drawings wherein.

Figure 1:
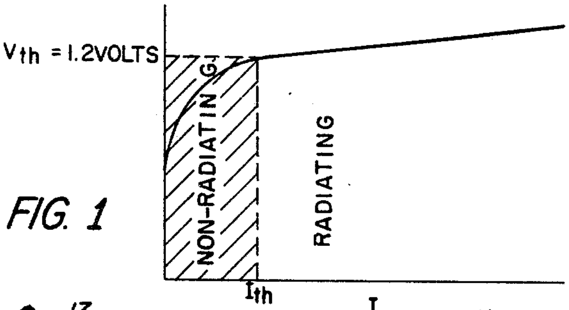
FIG. 1 is a diagram representing the I–V characteristics of a recombination-radiation diode.

Referring now to the drawings, FIG. 1 is a graph showing a forward-biased voltage current characteristic of a recombination-radiation diode, such as a gallium arsenide diode. The threshold voltage for a gallium arsenide diode is shown in the graph as being 1.2 volts. Below the 1.2 volt level, the diode device is substantially nonradiating. Above the threshold voltage, the device radiates electromagnetic energy. A typical example of a gallium arsenide recombination-radiation diode is shown in FIG. 2.

The diode structure 10 is comprised of a body of N-type doped material, such as, for example, gallium arsenide doped with Te to about $5\times10^{17}/\text{Cm.}^3$. To this body of N-type material zinc is diffused to form a region of P-type gallium arsenide 11 and a resulting junction 15 lying between the region 11 and the body 12. Contact is made to the N-type body 12 by a nickel ribbon, which is tin-clad, shown as region 13 and contact is made to region 11 by a gold-zinc wire shown at 14. This represents a P-doped alloyed contact. External connections are made to this diode at terminals 16 and 17. Light is emitted from the diode as shown by the dotted lines in FIG. 2 upon the application of a voltage greater than the threshold voltage of the diode device.

Figure 2:
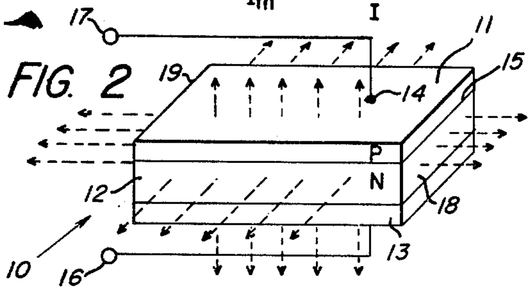
FIG. 2 is a view of a radiating diode showing radiation being emitted from a junction region of said diode.

In order to utilize the recombination-radiation diode of FIG. 2 as a lasering diode, an optical cavity or resonator is required, such as, for example, the Fabry-Perot type. In order to accomplish this, two surfaces 18 and 19, both perpendicular to the junction 15, are polished or cleaned to provide two parallel end surfaces. These surfaces will act to provide the Fabry-Perot resonator. A more complete discussion of a lasering diode device can be found in United States Patent No. 3,059,117, issued to W. S. Boyle et al. and the article "Infrared and Visible Emission From Forward-Biased P-N Junctions," R. H. Rediker, "Solid State Design," August 1963, volume 4, No. 8.

Figure 3:
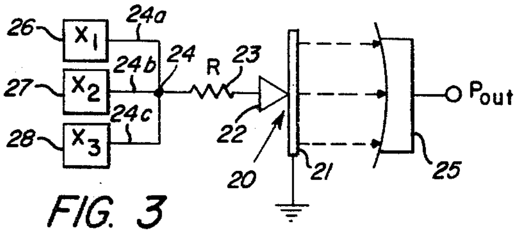
FIG. 3 is a circuit diagram of a recombination-radiation diode logical circuit.

In FIG. 3 there is disclosed a radiating threshold diode circuit which could be operated either as an "and," an "or," a "nor" or other type logical element. The diode is particularly suitable as a logical element inasmuch as it has a sharp threshold voltage, that is, a radiating diode or a lasering diode will precisely turn on or emit radiation when a predetermined current is passed through the junction of the diode. In FIG. 3, a recombination-radiation diode is shown generally at 20. The diode structure has a region 21 and a region 22. Connected to region 22 is an input resistor 23. Radiation is emitted from the diode as shown by the dotted lines in FIG. 3 and detected by a detector 25. The detector 25 provides an output voltage which is related to the amount of incident radiation received by the detector. Input signals are shown applied by boxes $X_1$, number 26; $X_2$, number 27; and $X_3$, number 28. These are applied to terminals **24*a* 24*b* and 24*c* respectively; 24*a*, 24*b* and 24*c* being an extension of terminal 24 which is connected to one end of resistor 23. The device can be operated as an "or" circuit if any of the sources 26, 27 and 28 provide a voltage greater than the threshold voltage. In this manner, the diode will turn on and emit radiation in response to the voltage signals. Additionally, any combination of the voltage signals provided by the voltage sources 26, 27 and 28** can be utilized to provide a voltage across the diode which is greater than the threshold of the diode. Thus, a logical element has been described which has a sharp turn on or cut off point of radiation and thus is particularly suitable as a logical element. The suitability of this device is further enhanced by its great switching speed. Switching transitions in the order of nanoseconds can be obtained with logical circuits utilizing recombination-radiation diodes as shown in FIG. 3.

Referring now to FIGS. 4, 5, 6, and 7, there is disclosed a recombination-radiation diode "3 x 3" matrix. Such a matrix, as shown in these figures, will emit radiation from a particular diode provided that the voltage across a particular diode is greater than the threshold voltage of the diode. By providing a voltage along a row and a voltage along a column, said voltage along the row and said voltage along the column summing to provide a coincident voltage across a diode which is greater than the threshold voltage of the diode, particular diodes in the matrix can be turned on at will.

Figure 4:
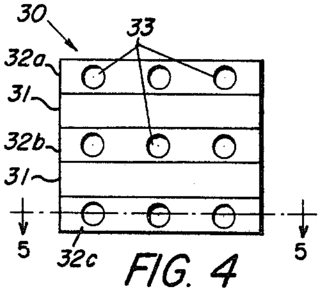
FIG. 4 is a bottom view of a recombination-radiation diode matrix.
Figure 5:
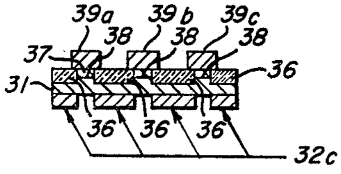
FIG. 5 is a sectional view of the recombination-radiation diode matrix of FIG. 4 taken along line 5—5.
Figure 6:
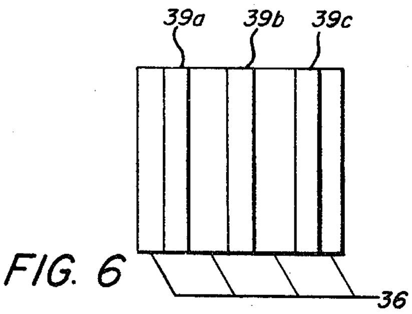
FIG. 6 is a top view of the recombination-radiation diode matrix of FIG. 4.

In FIGS. 4 through 6, a preferred semiconductor recombination-radiation diode matrix is shown. The diode 30 is constructed utilizing an N-type gallium arsenide body 31. The bottom side of the body 31, shown in FIG. 4, has evaporated thereon tin N-type contacts, shown as rows 32*a*, 32*b*, and 32*c*. The evaporated N-type contact has openings or holes therein which extend completely through the metal contact so as to expose a portion of the body 31. These openings or holes are positioned substantially in register with the junction of the diode to be formed, as will be disclosed in the following description. The holes or openings are shown generally at 33. The plurality of recombination-radiation diodes are formed by etching away portions of the body 31 so as to provide a plurality of raised semiconductor regions, shown as mesa regions 37. An oxide layer is laid down to separate and protect the junctions to be formed in these mesa regions 37. The oxide layer is shown at 36. In order to form the junction is the raised portion, zinc is diffused into the mesa regions.

The junction is formed generally at 38, as shown in FIG. 5. In order to make contact with the raised P-type regions 37, that is after the zinc is diffused into the raised region, a plurality of P-type contacts, such as lead-indium, are evaporated as shown in FIG. 6, and subsequently alloyed to complete the contact to the mesa diode regions. These are shown as columns 39*a*, 39*b*, and 39*c* on FIG. 6. Radiation is then emitted from the diode through the openings in the N-type contact upon the application of a coincident voltage across a diode. The emission of radiation is shown generally by the dotted arrows in FIG. 5.

As an alternate matrix embodiment, an N-type doped GaAs substrate having epitaxially P-type regions grown thereon to form columns and rows of recombination-radiation diodes could be utilized. Additionally, if desired, each of the P-type epitaxially grown regions could comprise $GaAs_xP_y$ where $x$ and $y$ $(y-1-x)$ are varied so as to provide a matrix having at least some diodes which are capable of emitting different frequencies of radiation. Additionally, other semiconductor compounds, such as silicon carbide, gallium phosphide, and gallium antimonide could be utilized in place of $GaAs_xP_y$.

Figure 7:
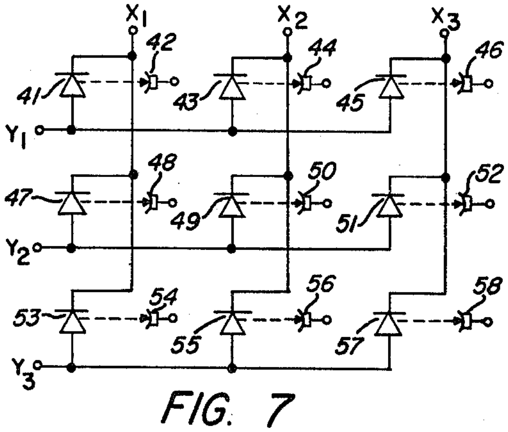
FIG. 7 is a circuit diagram of the recombination-radiation matrix of the FIGS. 4, 5, and 6.

In FIG. 7, there is disclosed a circuit diagram showing the connections of the diodes prepared in accordance with FIGS. 4 through 6. This matrix comprises diodes 41, 43, 45, 47, 49, 51, 53, 55, and 57 in a "3 x 3" matrix. Detectors 42, 44, 46, 48, 50, 52, 54, 56, and 58 are positioned, as shown in FIG. 7, to detect radiation from each of these diodes. External or input column connections are made, as shown by contacts $X_1$, $X_2$, and $X_3$, which form the columns of the matrix. The rows of the matrix are formed by external connections, contacts $Y_1$, $Y_2$, and $Y_3$. By applying a voltage from the contact $X_1$ and from the contact $Y_1$, a voltage is provided across diode 41 which is greater than the threshold voltage of diode 41. This will cause the diode to emit radiation which can then be detectod by detector 42. To turn on the diode, the voltage $Y_1$ is made positive and the voltage $X_1$ is made negative, thereby providing a summing voltage which is greater than the threshold voltage. Thus, a matrix has been disclosed which is particularly useable as a fixed storage device, said matrix emitting radiation upon the coincidence of a voltage appearing at the intersection of a column and a row.

Figure 8:
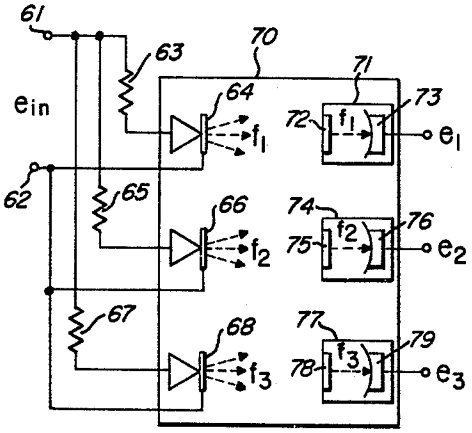
FIG. 8 is a quantizing circuit according to this invention.

Referring now to FIG. 8, a quantizing network is disclosed. This circuit can provide N-steps of voltage quantization by converting a voltage input signal into selected frequencies which differ for each step of voltage. This circuit comprises a plurality of recombination-radiation diodes, or if desired lasering diodes, of the type disclosed in FIG. 2. In the system of FIG. 8, three diodes 64, 66 and 68 are disclosed. Diode 64 emits a frequency $f_1$, diode 66 emits a frequency $f_2$, and diode 68 emits a frequency $f_3$. Each of the diodes have a different threshold radiation voltage and, additionally, emit a frequency which is different from that which is emitted from the remainder of the diodes. For example, diode 64 could comprise gallium antimonide which has a threshold voltage of .5 volt and emits radiation of 16,000 angstroms wavelength, diode 66 could comprise gallium arsenide which has a threshold voltage of 1.2 volts and emits radiation of 9,000 angstroms, and diode 68 comprises a gallium-arsenide-phosphide alloy wherein gallium arsenside represents 60% and gallium phosphide represents 40% by atomic percent. This composition has a threshold voltage 1.4 volts and emits radiation of 6,700 angstroms wavelength. Other possible compositions could include silicon carbide and other 2–6 periodic table classification element compounds. These three diodes 64, 66, and 68 are enclosed in a light-secured container 70.

An input voltage signal is applied at terminals 61 and 62. Diode 64 is coupled through current limiting or load resistor 63 to terminal 61, diode 66 is connected through a current limiting resistor 65 to terminal 61, and diode 68 is connected through a current limiting resistor 67 to terminal 61. To detect these various frequencies emitted by the plurality of diodes, three filter-detector combinations are shown as 71, 74, and 77. The filters are shown as 72, 75, and 78 respectively, and the detectors are shown as 73, 76, and 79 respectively. Filter 72, which could be of the common glass filter variety, is constructed such that it has a narrow pass band at frequency $f_1$, filter 75 is constructed to have a narrow pass band at the frequency $f_2$ and filter 78 is fabricated to have a narrow pass band at the frequency $f_3$. In this manner, each of the frequencies can be independently detected to provide output signals $e_1$, $e_2$, and $e_3$. Thus, a circuit has been provided which will convert or quantize an input voltage into a plurality of frequencies since each of these diodes has a different threshold voltage as well as a different narrow pass band output frequency of radiation. It is further noted that this circuit additionally provides electrical isolation between input and output connections. Furthermore, it is to be noted that in quantizing a voltage input signal, the first segment of the signal is represented by $f_1$, the second segment by $f_1$ and $f_2$ and the third segment by the presence of $f_1$, $f_2$ and $f_3$. It is to be realized that this circuit utilizing additional output frequency diodes can divide an input signal into a greater number of segments of $\Delta v$.

Although particular embodiments of recombination-radiation and lasering diode circuits have been described herein, various modifications may be made without departing from the spirit and scope of this invention.

What is claimed is:

1. In a system for quantizing an electrical input signal into a plurality of quantizing steps by means of optical coupling, a plurality of radiation semiconductor devices in a circuit with one another, each of said devices comprising a different semiconductor material, each of said devices having a different threshold voltage below which no radiation is emitted and above which a radiation of optical frequency, dependent upon the semiconductor material is emitted;

means for coupling an input voltage to said circuit;

means for utilizing the threshold properties of said devices in a quantization circuit such that input voltages applied to said circuit are emitted as optical frequencies quantized into $n$ successive steps depending on the number of said devices; and means for detecting each of said optical frequencies, thereby reconverting each of the quantized steps into separate electrical signals.

2. In a system for quantizing an electrical input signal into a plurality of quantizing steps by means of optical coupling, a plurality of radiation semiconductor devices in a circuit with one another, each of said device comprising a different semiconductor material, each of said devices having a different threshold voltage below which no radiation is emitted and above which a radiation of optical frequency, dependent upon the semiconductor material is emitted;

means for coupling an input voltage to said circuit;

means for utilizing the threshold properties of said devices in a quantization circuit such that at a voltage $V_1$ said lowest threshold device emits an optical frequency $f_1$, at a different and higher voltage $V_2$, another device emits an optical frequency $f_2$ resulting in the presence of both $f_1$ and $f_2$ and such quantization being continued through $n$ successive steps depending on the number of devices; and selective means for detecting each of said optical frequencies, thereby reconverting each of the quantized steps into separate electrical signals.

References Cited

UNITED STATES PATENTS

| | | | |
|---|---|---|---|
| 2,885,564 | 5/1959 | Marshall | 250—213 |
| 3,050,633 | 8/1962 | Loebner | 250—213 |
| 3,248,571 | 4/1966 | Cubert | 307—218 X |
| 3,270,235 | 8/1966 | Loebner | 250—217 |
| 3,290,517 | 12/1966 | Akmenkalns | 307—218 X |
| 3,321,631 | 5/1967 | Biard et al. | 250—209 |
| 3,059,118 | 10/1962 | Koury | 250—213 |
| 3,293,513 | 12/1966 | Biard et al. | 250—217 X |
| 3,371,243 | 2/1968 | Bramley et al. | 250—217 X |
| 3,059,117 | 10/1962 | Boyle et al. | 317—235 |
| 3,187,193 | 6/1965 | Rappaport et al. | 307—88.5 |
| 3,299,104 | 1/1966 | Rutz | 250—217 |

OTHER REFERENCES

Yu: IBM Tech. Discl. Bulletin; vol. 6; No. 4; September 1963; p. 63.

Biard et al.: Digest of Technical Papers of the International Solid-State Circuits Conf. held at the Univ. of Penn. February 1963; pp. 108, 109.

WALTER STOLWEIN, Primary Examiner

U.S. Cl. X.R.

250—208, 211